(12) United States Patent
Nakanishi et al.

(10) Patent No.: US 7,564,129 B2
(45) Date of Patent: Jul. 21, 2009

(54) POWER SEMICONDUCTOR MODULE, AND POWER SEMICONDUCTOR DEVICE HAVING THE MODULE MOUNTED THEREIN

(75) Inventors: Raita Nakanishi, Kameoka (JP); Toshiaki Kawamura, Kameoka (JP)

(73) Assignee: Nichicon Corporation, Kyoto (JP)

( * ) Notice: Subject to any disclaimer, the term of this patent is extended or adjusted under 35 U.S.C. 154(b) by 0 days.

(21) Appl. No.: 12/079,012

(22) Filed: Mar. 24, 2008

(65) Prior Publication Data

US 2008/0237847 A1 Oct. 2, 2008

(51) Int. Cl.
*H01L 23/34* (2006.01)
(52) U.S. Cl. .................. 257/722; 257/706; 257/711; 257/712; 257/713; 257/718; 257/719; 257/720; 257/E23.08; 257/E23.084; 257/E23.105
(58) Field of Classification Search ................ 257/276, 257/625, 675, 704, 706, 707, 709–722, 729, 257/735, 736, E33.075, E31.131, E23.08–E23.113
See application file for complete search history.

(56) References Cited

U.S. PATENT DOCUMENTS 4,561,010 A * 12/1985 Ogihara et al. ............... 257/705
5,504,378 A * 4/1996 Lindberg et al. ............. 307/10.1

2003/0009695 A1 1/2003 Sato
2006/0202324 A1 * 9/2006 Hashimoto et al. ........... 257/706

FOREIGN PATENT DOCUMENTS

JP 2003-18178 1/2003

* cited by examiner

*Primary Examiner*—Jasmine J Clark
(74) *Attorney, Agent, or Firm*—Jordan and Hamburg LLP

(57) ABSTRACT

A power semiconductor module according to the present invention includes: a planar base plate having a plurality of insulated substrates soldered on the top surface, the insulated substrates each having power semiconductor elements to be cooled mounted thereon; a plurality of radiation fins projecting from the bottom surface side of the base plate; and a peripheral wall projecting from the bottom surface side of the base plate so as to surround the radiation fins, the projecting length of the radiation fins is less than or equal to that of the peripheral wall, and the peripheral wall has end surfaces present in the same plane. In addition, a power semiconductor device having the power semiconductor module mounted therein includes: at least one reinforcing plate disposed on the top surface side of the base plate via a first buffering member; and a cooling jacket fixed to the bottom surface side of the base plate via a second buffering member with a plurality of tightening fixtures passing through the reinforcing plate and the base plate, the cooling jacket having a flow passage for a cooling medium formed to intervene in a position with respect to the base plate, and the first buffering member and the second buffering member are respectively disposed at least inside and outside with respect to the tightening fixtures.

20 Claims, 13 Drawing Sheets

POWER SEMICONDUCTOR MODULE, AND POWER SEMICONDUCTOR DEVICE HAVING THE MODULE MOUNTED THEREIN

CROSS REFERENCE TO RELATED APPLICATION

The disclosure of Japanese Patent Applications No. 2007-092777 filed Mar. 30, 2007 and No. 2007-159783 filed Jun. 18, 2007 including specification, drawings and claims is incorporated herein by reference in its entirety.

BACKGROUND OF THE INVENTION

1. Field of the Invention

The present invention relates to power semiconductor modules in which insulated substrates provided with power semiconductor elements made up of silicon (Si) or silicon carbide (SiC), such as IGBTs (insulated gate bipolar transistors) and MOS FETs, are mounted on a base plate, which is directly cooled by a cooling medium, and the present invention also relates to power semiconductor devices having such a module mounted therein.

2. Description of the Background Art

Typically, hybrid vehicles or electric vehicles use electric power conversion equipment (hereinafter, an "inverter device") for driving a large capacity drive motor. A power semiconductor module, such as an IGBT module, is used as the inverter device to convert DC power to three-phase AC power to drive the drive motor, as well as to convert three-phase AC power to DC power to recycle energy. The power semiconductor module drives the drive motor while controlling high current, and therefore generates an extremely large amount of heat. On the other hand, the power semiconductor module to be mounted in hybrid vehicles or electric vehicles needs to be compact. Accordingly, in general, the power semiconductor module is cooled using a water-cooling structure with high cooling efficiency.

FIGS. 1A and 1B illustrate an example of the so-called indirect cooling structure that radiates heat by mounting a power semiconductor module on a mounting surface of a cooling jacket in which a cooling medium is circulated. The power semiconductor module 2 is bolted to the mounting surface 20 of the cooling jacket 20, as shown in FIG. 1A. Silicone grease for reducing thermal resistance is applied to the contact surface between the power semiconductor module 2 and the cooling jacket 20 to enhance thermal conductivity. The cooling medium is introduced from an intake port 21, and discharged from a discharge port 22 after passing through the inside of the cooling jacket 20. In addition, integrally-formed radiation fins 5 are arranged in the cooling jacket 20 at intervals of 1 to 2 mm to enhance radiation performance.

FIG. 1B is a cross-sectional view of a power semiconductor device 1 structured by combining the power semiconductor module 2 and the cooling jacket 20, as seen from direction B indicated in FIG. 1A. The power semiconductor module 2 is configured by soldering insulated substrates 9 having power semiconductor elements 8 mounted thereon to the top surface of a base plate 4, and furthermore, attaching a housing 24 to the base plate 4 so as to surround the power semiconductor elements 8. The insulated substrates 9 are each composed of: an insulated layer 10 made up of an insulated material, such as an insulated ceramic (e.g., aluminum nitride or silicon nitride), which has satisfactory thermal conductivity characteristics and a linear expansion coefficient close to that of silicon (Si); and metal layers 11a and 11b tightly provided on both surfaces of the insulated layer 10 and made up of copper, aluminum, or the like. The power semiconductor elements 8 are soldered on the upper metal layers 11a. In addition, the lower metal layer 11b is soldered on the top surface of the base plate 4.

The thickness of the metal layers 11a and 11b is determined considering the amount of current flowing through circuit patterns. In addition, the thickness of the base plate 4 is typically set at 3 to 4 mm to enhance its function as a thermal diffusion plate, thereby enhancing heat capacity. Furthermore, external terminals 25 are attached to the housing 24, and bonded to the power semiconductor elements 8 or the upper metal layers 11a via aluminum wiring. In the case where the housing 24 is conductive, the housing 24 is suitably insulated from the external terminals 25.

As described above, in the case of the indirect cooling-type power semiconductor device 1 shown in FIGS. 1A and 1B, silicone grease is applied to the contact surface between the power semiconductor module 2 and the cooling jacket 20 to reduce thermal resistance at the contact surface between them. However, the thermal conductivity of typically-used silicone grease is about 1 W/m·K, which is lower by two or more digits compared to the base plate 4 and the insulated substrates 9, and therefore heat generated by the power semiconductor elements 8 cannot be sufficiently conducted to the cooling jacket 20, resulting in poor radiation performance.

Therefore, for example, Japanese Laid-Open Patent Publication No. 2003-18178 has proposed a power semiconductor device 1 shown in FIG. 2. This power semiconductor device 1 includes a finned base plate 3, which is itself integrally formed with the radiation fins 5, so that the bottom surface of the finned base plate 3 is directly cooled by a cooling medium circulating in the cooling jacket 20.

Also, in the case of the power semiconductor device 1 shown in FIG. 2, the insulated substrates 9 and the finned base plate 3 are made up of materials each having a linear expansion coefficient close to that of the power semiconductor elements 8, thereby preventing any cracks in solder layers 12 located between the power semiconductor elements 8 and the insulated substrates 9, and between the insulated substrates 9 and the finned base plate 3.

For example, silicon (Si), which is a constituent material of the power semiconductor elements 8, has a linear expansion coefficient of about 3 ppm/° C., and therefore aluminum or silicon nitride substrates having a linear expansion coefficient of 3 to 5 ppm/° C. are used as the insulated substrates 9. Also, in consideration of ease of processing, an Al—SiC (aluminum-silicon carbide) composite plate having a linear expansion coefficient of 3 to 8 ppm/° C. is used as the finned base plate 3. The finned base plate 3 formed by the Al—SiC composite plate makes it possible to prevent any cracks in the solder layers 12, and furthermore, the radiation fins 5 exhibiting a complicated shape can be readily formed by metallic molding.

SUMMARY OF THE INVENTION

However, the conventional power semiconductor device 1 shown in FIG. 2 has three problems specified below.

[First Problem] Uniform Soldering

Before describing the first problem "uniform soldering", the steps of soldering between the power semiconductor elements 8 and the insulated substrates 9, and between the insulated substrates 9 and the finned base plate 3 will be described first.

In the case of the power semiconductor device 1 shown in FIG. 2, there are large soldered areas between the power semiconductor elements 8 and the insulated substrates 9, and between the insulated substrates 9 and the finned base plate 3, and therefore if the steps of soldering are performed in the air, airspaces (hereinafter, "voids") might be generated in the molten solder layers 12 by air bubbles. If any voids are generated, heat generated by the power semiconductor elements 8 cannot be efficiently conducted to the finned base plate 3, so that the heat from the power semiconductor elements 8 cannot radiate sufficiently, causing problems such as limitations in the range of operating current. Therefore, the steps of soldering are performed using a vacuum reflow furnace capable of melting solder in reduced-pressure atmosphere.

FIG. 3 illustrates how the steps of soldering between the power semiconductor elements 8 and the insulated substrates 9, and between the insulated substrates 9 and the finned base plate 3 are performed in the vacuum reflow furnace. Soldering foils 12 of roughly the same size as their respective power semiconductor elements 8 are placed between the power semiconductor elements 8 and the insulated substrates 9. In addition, soldering foils 12 of roughly the same size as the insulated substrates 9 are placed between the insulated substrates 9 and the finned base plate 3. Instead of placing the soldering foils 12 in such a manner, soldering paste may be applied. The finned base plate 3 having the power semiconductor elements 8 and the insulated substrates 9 disposed thereon is placed on a flat heat exchanger plate 40. The vacuum reflow furnace has heat sources (a bottom heater 41 and a top heater 42) respectively disposed inside of the heat exchanger plate 40 and on the ceiling of the vacuum reflow furnace.

In the steps of soldering, first, the air in the vacuum reflow furnace is replaced by $N_2$, and the temperature is raised to a point immediately below the melting point of solder. Then, by keeping that state for a predetermined period of time, internal temperatures of the finned base plate 3 and the insulated substrates 9 are equalized, and the soldering foils 12 are softened. Next, $N_2$ in the vacuum reflow furnace is discharged to reduce the degree of vacuum to several kPa, and thereafter the vacuum reflow furnace is kept at a temperature higher than the melting point of solder for a predetermined period of time, thereby melting the solder. The pressure reduction at the time of melting the solder is intended to purge air bubbles generated in the soldering foils 12, thereby inhibiting generation of any voids.

The top heater 42 and/or the bottom heater 41 is/are used to heat the inside of the vacuum reflow furnace, but solid heat conduction from the bottom heater 41 plays a dominant role during the pressure reduction, and radiation heat conduction from the top heater 42 constitutes only an auxiliary contribution. Accordingly, in the case of the power semiconductor module 2 shown in FIG. 2, uniform soldering between the power semiconductor elements 8 and the insulated substrates 9, and between the insulated substrates 9 and the finned base plate 3 greatly relies on the stability of contact between the tips of the radiation fins 5 and the heat exchanger plate 40.

Typically, the finned base plate 3 formed by an Al—SiC composite plate is shaped by green processing or metallic molding. However, any shaping method causes slight variations in shape (in particular, projecting length) among the radiation fins 5, making it difficult to allow all the radiation fins 5 to uniformly contact the heat exchanger plate 40. Therefore, thermal conduction from the heat exchanger plate 40 to the finned base plate 3 and to the insulated substrates 9 is rendered non-uniform, resulting in voids due to uneven melting of the soldering foils 12.

[Second Problem] Uniform Cooling of the Power Semiconductor Elements

Next, the second problem "uniform cooling of the power semiconductor elements" will be described with reference to a top view (FIG. 4A) of the power semiconductor device shown in FIG. 2, and a cross-sectional view (FIG. 4B) seen from the direction perpendicular to FIG. 2. Note that the power semiconductor elements mounted on the insulated substrates 9 are omitted in FIG. 4A.

In the case of the power semiconductor device 1 shown in FIGS. 4A and 4B, the cooling medium flows from the intake port 21 to the discharge port 22 through the flow passage formed by two chassis members 27a and 27b attached via a liquid gasket. The finned base plate 3 is bolted at its perimeter to a chassis 26 after fitting the radiation fins 5 in the opening of the chassis 26. The flow passage for the cooling medium is liquid-tightly sealed by a seal material 28 (O-ring) sandwiched between the finned base plate 3 and the chassis member 27a.

Flow amounts of the cooling medium in the power semiconductor device 1 are as indicated by arrows in FIG. 4A. Specifically, the distance of the flow passage between the intake port 21 and the discharge port 22 is short in the inner portion (from the left end of the intake port 21 to the right end of the discharge port 22), whereas it is long in the outer portion (from the right end of the intake port 21 to the left end of the discharge port 22). In addition, the flow amount of the cooling medium depends on the distance of the flow passage, and the cooling capacity depends on the flow amount. Accordingly, the degree of cooling by the cooling medium varies among the power semiconductor elements (not shown) on the insulated substrates 9 depending on their mounting places. As a result, the temperature of any power semiconductor element that is not sufficiently cooled rises remarkably, resulting in problems such as limitations in the range of operating current.

[Third Problem] Prevention of Cracks in the Finned Base Plate

Next, the third problem "prevention of cracks in the finned base plate" will be described. As described earlier, the finned base plate 3 formed by an Al—SiC composite plate has advantages, for example, in that the difference from the insulated substrates 9 in terms of linear expansion coefficient is small, and it has a superior workability. However, the Al—SiC composite plate has a disadvantage in that its fracture toughness is low due to properties (i.e., high hardness and low viscosity) of its main component, silicon carbide. Therefore, in the case of the conventional power semiconductor device 1 having the finned base plate 3 formed by the Al—SiC composite plate, when ambient temperature rises/falls with the finned base plate 3 being bolted to the cooling jacket 20, cracks might be caused in the finned base plate 3 due to stress imposed on bolted portions.

This is concretely described with reference to FIG. 5. FIG. 5 is an enlarged cross-sectional view of a bolted portion in which the finned base plate 3 shown in FIG. 2 and the housing 24 (omitted in FIG. 2) disposed on its top surface side are mounted on the cooling jacket 20 with a bolt 33. In FIG. 5, the O-ring 28 used as a seal material is fitted in a groove formed in the cooling jacket 20 made up of aluminum, and the finned base plate 3 formed by the Al—SiC composite plate and the housing 24 are bolted to the cooling jacket 20 outside the O-ring 28. A pressing force P caused by bolting presses the finned base plate 3 against the cooling jacket 20 with the finned base plate 3 compressing the O-ring 28. Therefore, there is a slight gap between the finned base plate 3 and the cooling jacket 20 on the inside with respect to the bolt 33, while the finned base plate 3 is placed in close contact with the cooling jacket 20 on the outside with respect to the bolt 33 where no O-ring 28 is present.

The aluminum cooling jacket 20 (about 24 ppm/° C.) thermally expands/contracts more than the finned base plate 3 having a smaller linear expansion coefficient (3 to 8 ppm/° C.). Accordingly, when the power semiconductor device 1 shown in FIG. 5 is subjected to a temperature cycling test in the range from −40 to +85° C., assuming the environment of a vehicle in which it is installed, a portion of the cooling jacket 20 that is located outside with respect to the bolt 33 expands outwardly at high temperature. Then, a frictional force W corresponding to the difference in linear expansion coefficient between the cooling jacket 20 and the finned base plate 3 is generated at the interface between the expanding portion of the cooling jacket 20 and the portion of the finned base plate 3 that is in direct contact with that expanding portion. The frictional force W causes a tensile force E pulling the finned base plate 3 outwardly with respect to the bolted portion. Then, when the tensile force E exceeds the fracture toughness of the Al—SiC composite plate, a crack 43 is generated, extending from roughly the center of the bolted portion on the top surface side of the finned base plate 3 toward the bottom surface side of the finned base plate 3. Once the crack 43 is caused, the liquid tightness provided by the O-ring 28 deteriorates, so that the cooling medium flowing between the radiation fins 5 might leak out.

Therefore, the present invention aims to provide a power semiconductor module capable of solving the first problem, i.e., non-uniform soldering between the power semiconductor elements and the insulated substrates, and between the insulated substrates and the finned base plate, and also to provide a power semiconductor device having the module mounted therein.

In addition, the present invention aims to provide a power semiconductor module capable of solving the first problem as well as the second problem, i.e., non-uniform cooling of the power semiconductor elements resulting from non-uniform flow distribution of the cooling medium, and also to provide a power semiconductor device having the module mounted therein.

Furthermore, the present invention aims to provide a power semiconductor device capable of solving the third problem, i.e., inhibition of crack generation in the base plate, and assurance of the liquid tightness of the flow passage for the cooling medium, for example, even when the base plate is formed by a material having a low fracture toughness, such as an Al—SiC composite plate.

To solve the above problems, the present invention provides a first power semiconductor module comprising: a plurality of power semiconductor elements; a plurality of insulated substrates having the power semiconductor elements soldered on their top surfaces; a planar base plate having bottom surfaces of the insulated substrates soldered on its top surface; a plurality of radiation fins projecting from an area on a bottom surface side of the base plate, the area being on the opposite side to a junction area between the insulated substrates and the base plate; and a peripheral wall projecting from the bottom surface side of the base plate so as to surround the radiation fins, wherein the base plate, the radiation fins, and the peripheral wall are integrally formed to constitute a finned base plate, wherein the radiation fins are disposed along a flowing direction of a cooling medium, wherein a projecting length of the radiation fins is less than or equal to that of the peripheral wall, and wherein the peripheral wall has end surfaces present in the same plane.

In addition, the present invention provides a second power semiconductor module comprising: a plurality of power semiconductor elements; a thermal diffusion plate having the power semiconductor elements soldered on its top surface; an insulated resin layer disposed on a bottom surface side of the thermal diffusion plate; a planar base plate having the insulated resin layer in close contact with its top surface; a plurality of radiation fins projecting from an area on a bottom surface side of the base plate, the area being on the opposite side to a junction area between the insulated resin layer and the base plate; and a peripheral wall projecting from the bottom surface side of the base plate so as to surround the radiation fins, wherein the base plate, the radiation fins, and the peripheral wall are integrally formed to constitute a finned base plate, wherein the radiation fins are disposed along a flowing direction of a cooling medium, wherein a projecting length of the radiation fins is less than or equal to that of the peripheral wall, and wherein the peripheral wall has end surfaces present in the same plane.

In addition, to solve the above problems, the present invention provides a first power semiconductor device comprising: the first or second power semiconductor module; and a cooling jacket attached to the end surfaces of the peripheral wall in the power semiconductor module via a seal material, so as to form discrete portions of a flow passage for the cooling medium between the radiation fins, wherein the cooling jacket has an intake port for introducing the cooling medium into the flow passage, and a discharge port for discharging the cooling medium from the flow passage, such that the intake port and the discharge port are disposed at diagonally-opposed corners of a space constituting the flow passage.

In addition, the present invention provides a second power semiconductor device comprising: a base plate having power semiconductor elements to be cooled mounted on its top surface side; a reinforcing plate disposed on the top surface side of the base plate; a cooling jacket fixed to a bottom surface side of the base plate with a plurality of tightening fixtures passing through the reinforcing plate and the base plate, the cooling jacket having a flow passage for a cooling medium formed to intervene in a position with respect to the base plate; a first buffering member disposed between the reinforcing plate and the base plate; and a second buffering member disposed between the base plate and the cooling jacket, wherein the cooling jacket and the reinforcing plate each have a linear expansion coefficient greater than that of the base plate, and wherein the first buffering member and the second buffering member are respectively disposed at least inside and outside with respect to the tightening fixtures.

DESCRIPTION OF THE PREFERRED EMBODIMENTS

Hereinafter, preferred embodiments of the present invention will be described with reference to the accompanying drawings.

First Embodiment

Figure 6A:
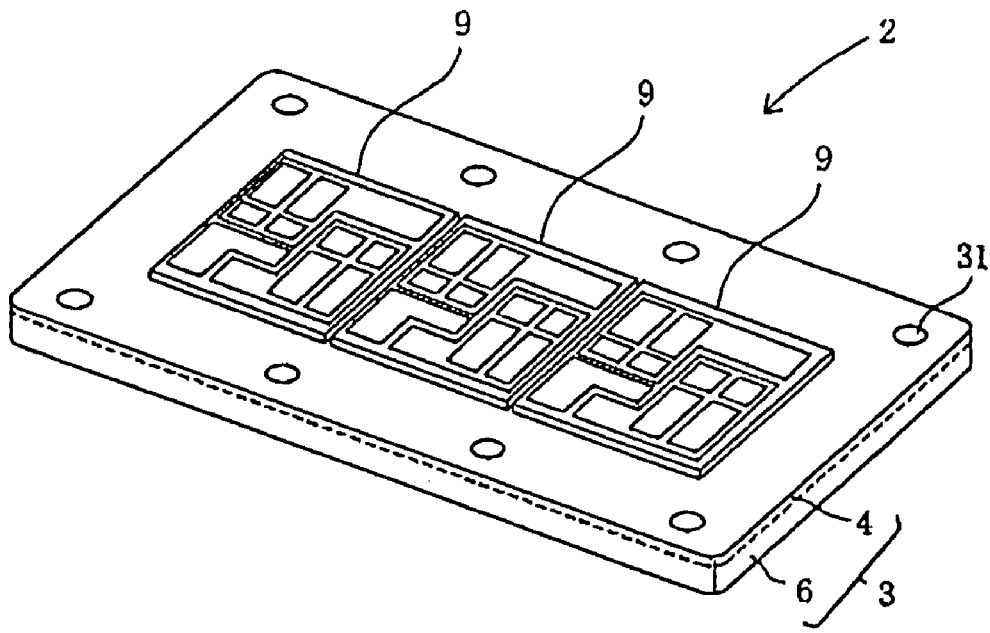
FIG. 6A is a perspective view of a power semiconductor module according to a first embodiment seen from the top surface side.
Figure 6B:
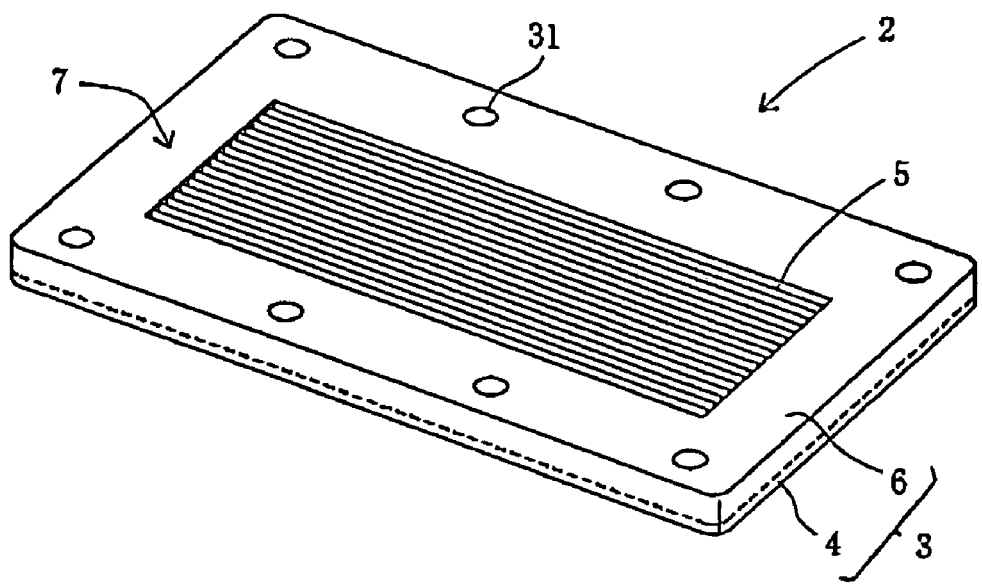
FIG. 6B is a perspective view of the power semiconductor module according to the first embodiment seen from the bottom surface side.

FIGS. 6A and 6B are respectively a perspective view of a 600V/600A class direct cooling-type power semiconductor module 2 seen from the top surface side, and a perspective view thereof seen from the bottom surface side. In FIG. 6A, the finned base plate 3 has three insulated substrates 9 disposed on the top surface. In the present embodiment, the insulated substrates 9 are each made up of aluminum nitride, and they are all configured in the same manner. The insulated substrates 9 constitute upper and lower arms of a phase U inverter, a phase V inverter, and a phase W inverter, respectively.

In the present embodiment, the finned base plate 3 has a size of 10 cm×21 cm. In addition, the finned base plate 3 is 11 mm thick, including the planer base plate 4 located on the top surface side, which is 3 mm thick. The material of the finned base plate 3 is an Al—SiC composite material, and each surface thereof is plated with Ni. The finned base plate 3 is made by impregnating a molded product with Al, the molded product being obtained by mixing a suitable binder with an ingredient mainly composed of silicon carbide, and thereafter sintering the mixture to increase its hardness. The Al—SiC composite material is suitable for metallic molding of a complicated shape, and does not require any troublesome process such as cutting work to form the radiation fins 5.

Also, in the present embodiment, the insulated substrates 9 each have a size of 4.7 cm×6.0 cm, and are obtained by joining four IGBT elements, each having a chip size of 10 mm×16 mm, and four FWD elements, each having a chip size of 7 mm×10 mm, using lead-free solder having a melting point of 240° C. or higher. The solder is about 0.1 mm thick. The voltage/current rating of each element is 600V/300A, and two elements are connected in parallel to form a module with a rating of 600V/600A.

Figure 1A:
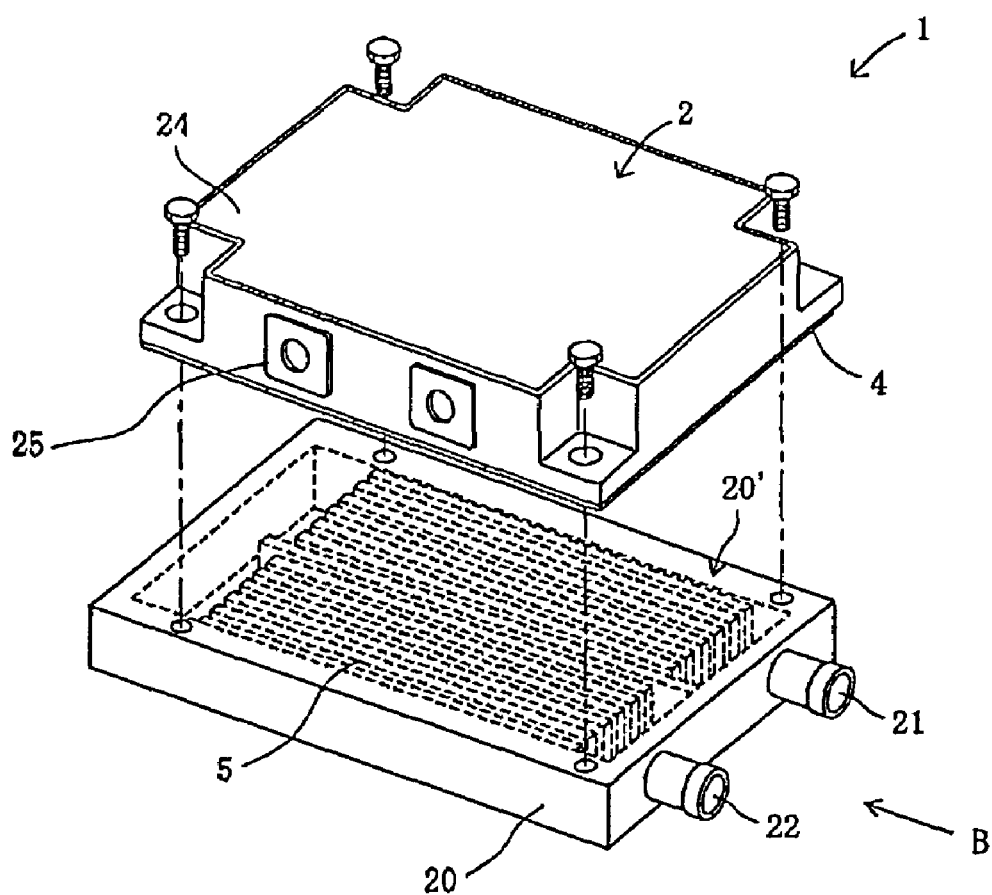
FIG. 1A is an exploded perspective view of a conventional indirect cooling-type power semiconductor device.
Figure 1B:
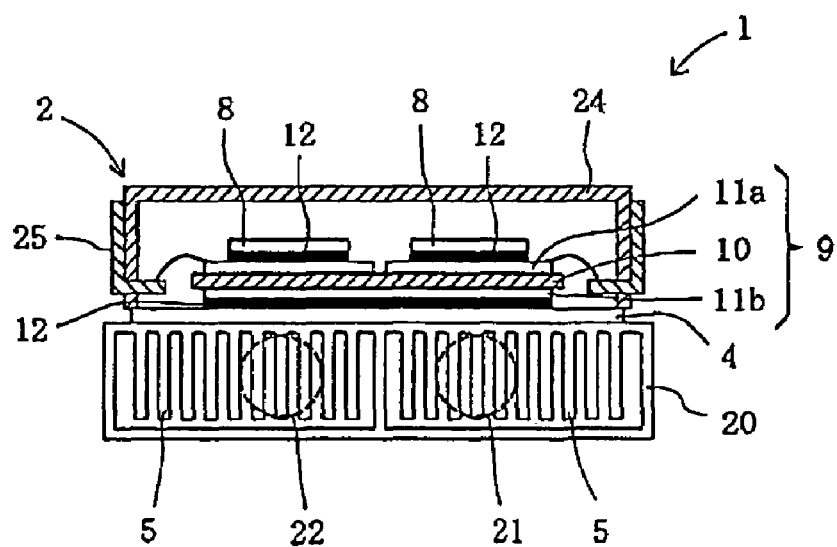
FIG. 1B is a cross-sectional view of the conventional indirect cooling-type power semiconductor device.
Figure 2:
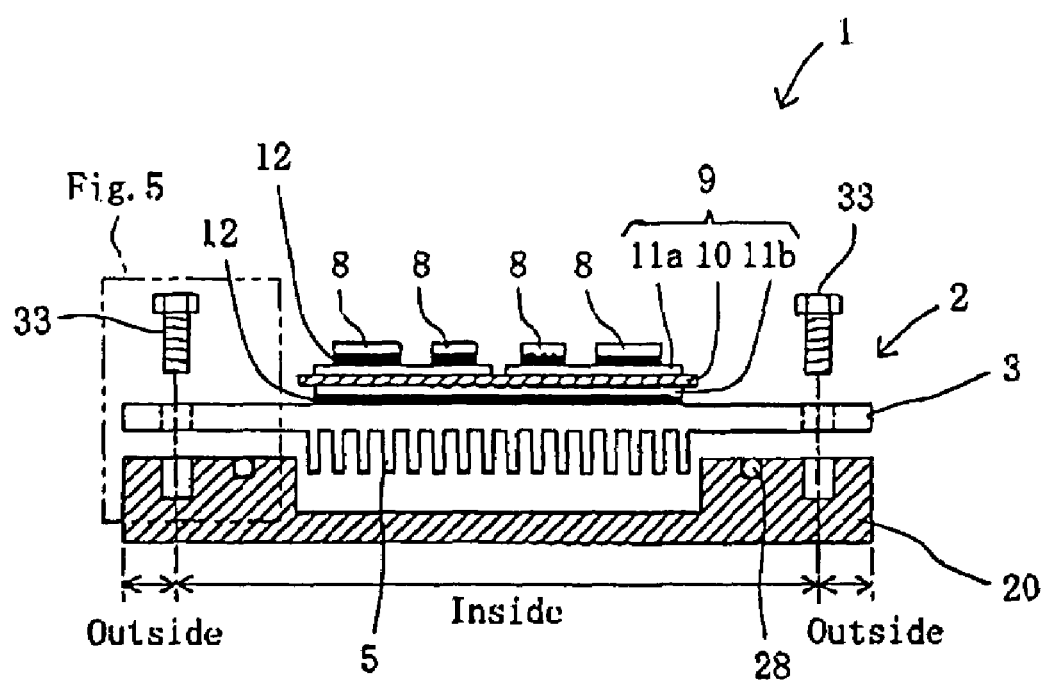
FIG. 2 is an exploded cross-sectional view of a conventional direct cooling-type power semiconductor device.

The insulated substrates 9 and the finned base plate 3 are joined using lead-free solder having a melting point of about 200° C. The solder is about 0.1 mm thick. Note that for the sake of simplification, the housing surrounding the top surface side of the finned base plate 3 and the aluminum connection wiring (see FIG. 1B) are omitted in FIG. 6A.

The radiation fins 5 integrally formed with the bottom surface of the finned base plate 3 are disposed in parallel to the longitudinal direction of the finned base plate 3 (the flowing direction of the cooling medium), as shown in FIG. 6B. In the present embodiment, seventeen radiation fins 5 are formed, each having a projecting length of 8 mm and a width of 1.5 mm. In addition, the radiation fins 5 are 3 mm pitch (i.e., the distance from center to center of any two adjacent radiation fins 5 is 3 mm), and discrete flow passage portions between the radiation fins 5 are 1.5 mm wide (see FIG. 7). Note that the projecting lengths of the radiation fins 5 and a peripheral wall 6 to be described later are defined herein on the basis of the bottom surface of the planar base plate 4.

Figure 7:
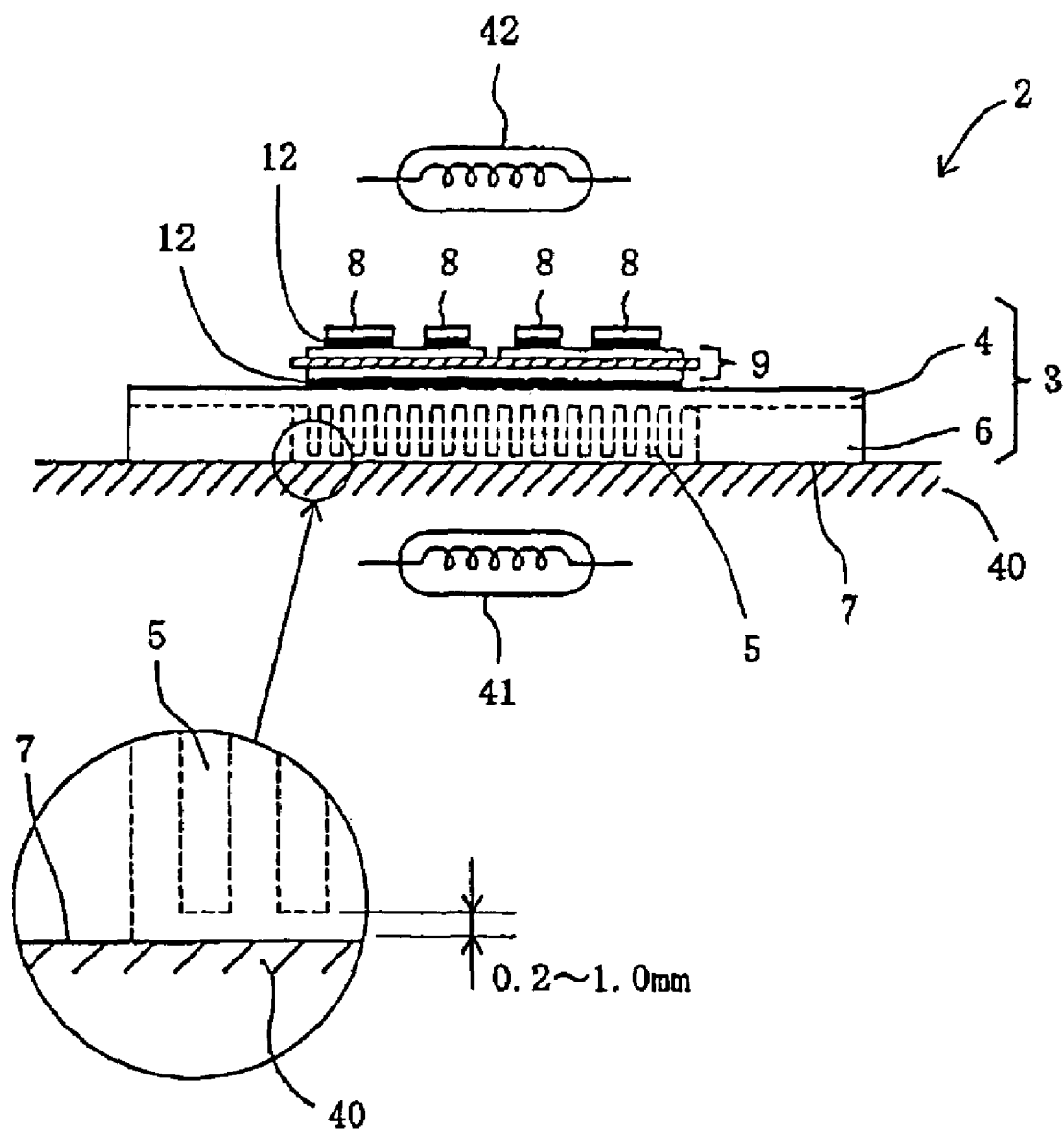
FIG. 7 is a cross-sectional view illustrating the soldering step for the power semiconductor module according to the first embodiment.

The projecting length of the peripheral wall 6 surrounding the radiation fins 5 is equal to or slightly longer than the projecting length of the radiation fins 5 (see FIG. 7). In addition, the peripheral wall 6 has peripheral wall end surfaces 7 present in the same plane parallel to the bottom surface of the base plate 4, and is brought into contact with the heat exchanger plate 40 on the end surfaces. The peripheral wall 6 shown in FIG. 6B is 20 mm wide in the longitudinal direction, and 15 mm in the direction perpendicular to the longitudinal direction. In addition, the peripheral wall 6 is suitably provided with through-holes 31 used for bolting the power semiconductor module 2 to the cooling jacket.

Figure 8A:
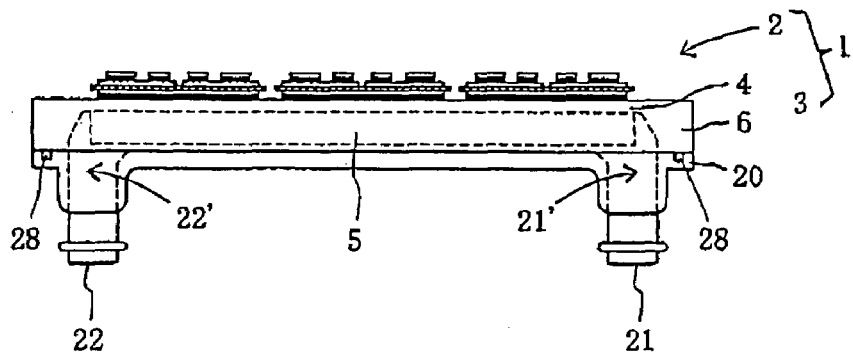
FIG. 8A is a cross-sectional view of a power semiconductor device according to the first embodiment.
Figure 8B:
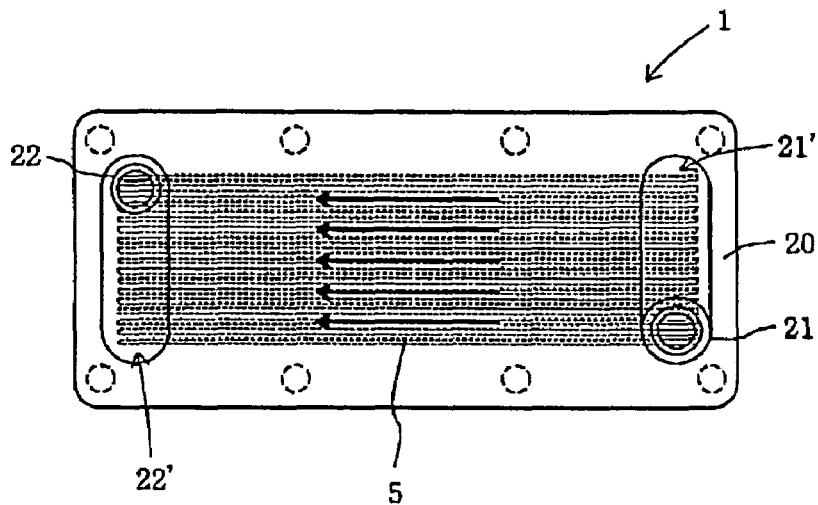
FIG. 8B is a top view illustrating the flow of a cooling medium in the power semiconductor device according to the first embodiment.

FIGS. 8A and 8B illustrate the power semiconductor device 1 in which the power semiconductor module 2 shown in FIGS. 6A and 6B is integrated with the cooling jacket 20 via a seal material 28. In the power semiconductor device 1, the cooling medium is introduced from the intake port 21 into the flow passage accommodating the radiation fins 5, and discharged from the discharge port 22 after flowing between the radiation fins 5. In the present embodiment, the intake port 21 and the discharge port 22 each have an internal diameter of 15 mm.

Note that the cooling medium used in the present embodiment is mainly composed of 50 vol. % ethylene glycol long-life coolant (LLC). In addition, the seal material 28 is an O-ring or metal gasket formed by an elastic material mainly composed of ethylene propylene- or silicone-based resin.

The cooling jacket 20 includes an intake cavity 21' and a discharge cavity 22', which are respectively provided immediately above the intake port 21 and the discharge port 22, as shown in FIGS. 8A and 8B. In addition, the intake port 21 and the discharge port 22 are located immediately below the intake cavity 21' and the discharge cavity 22', respectively, at diagonally-opposed corners of a space constituting the flow passage for the cooling medium, as shown in FIG. 8B. Specifically, in the present embodiment, the cooling medium introduced from the intake port 21 is distributed to all the radiation fins 5 in the intake cavity 21', and then collected in the discharged cavity 22' to be discharged from the discharge port 22.

In addition, by disposing the intake port 21 and the discharge port 22 at the diagonally-opposed corners, the distance of the flow passage from the intake port 21 to the discharge port 22 is equalized among the radiation fins 5, as shown in FIG. 8B. Accordingly, in the case of the power semiconductor device 1 according to the present embodiment, the flow distribution of the cooling medium flowing between the radiation fins 5 is rendered uniform, and therefore a stable cooling capacity can be achieved without any variations in degree of coolness among the power semiconductor elements depending on their mounting locations.

Figure 9:
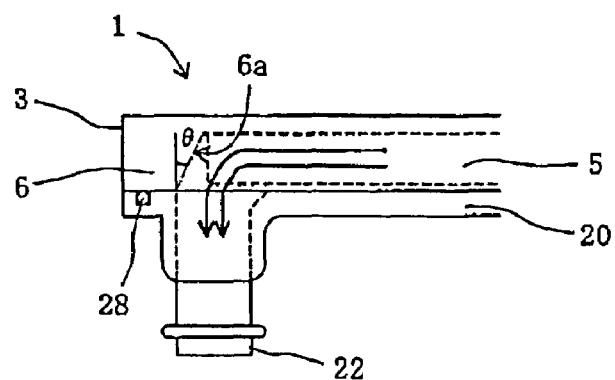
FIG. 9 is an enlarged cross-sectional view of a portion of the power semiconductor device according to the first embodiment, including a discharge port and its periphery.

Furthermore, in the power semiconductor device 1 according to the present embodiment, a taper 6a inclined by 30° toward the radiation fins 5 with respect to the vertical direction is formed at one of the inner wall surfaces of the peripheral wall 6 surrounding the radiation fins 5, the surface being perpendicular to the flowing direction of the cooling medium flowing between the radiation fins 5, as shown in FIG. 9. A similar taper is also formed at the intake side. Thus, it is possible to reduce any pressure loss due to the flowing direction of the cooling medium changing from the vertical direction to the horizontal direction or vice versa, thereby making it possible to allow the cooling medium to flow smoothly. Note that the above effect becomes more apparent as the taper angle θ is increased, but the taper angle θ is preferably set within the range from 15 to 45° in order not to reduce the surface area of the radiation fins 5, resulting in a reduction of the cooling capacity.

Figure 3:
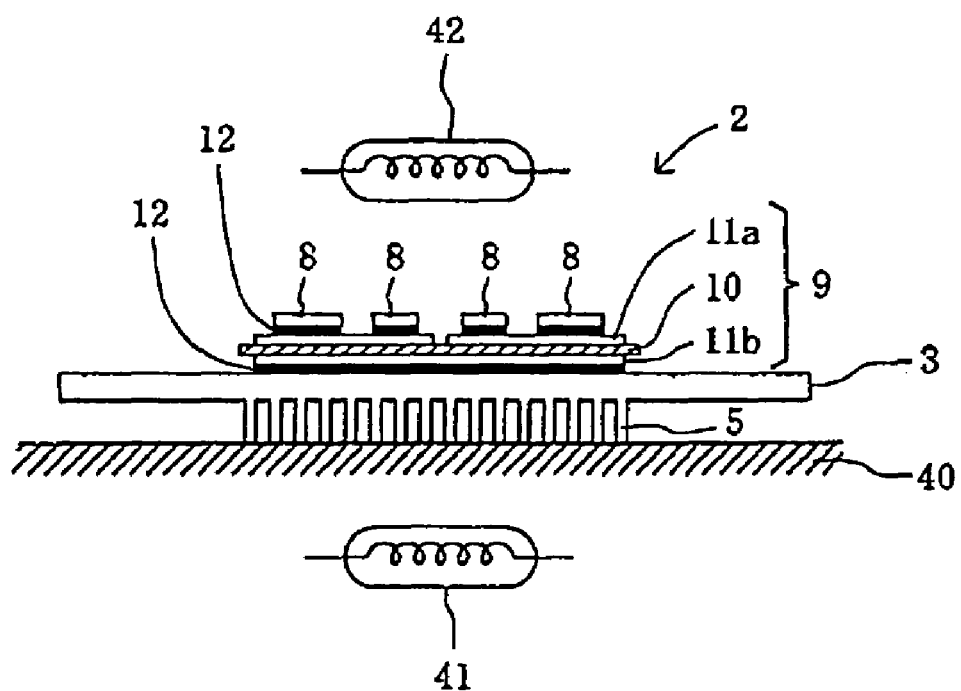
FIG. 3 is a cross-sectional view illustrating the soldering step for a conventional direct cooling-type power semiconductor module.
Figure 4A:
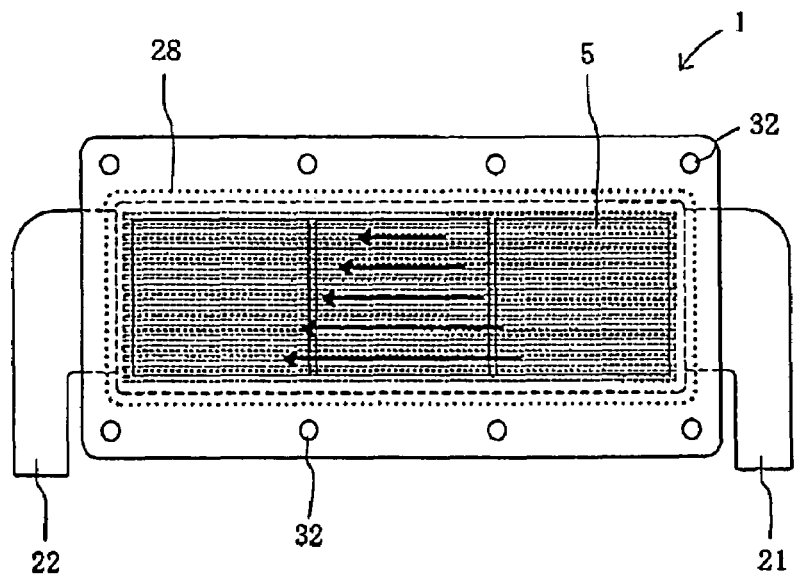
FIG. 4A is a top view illustrating the flow of a cooling medium in the conventional direct cooling-type power semiconductor device.
Figure 4B:
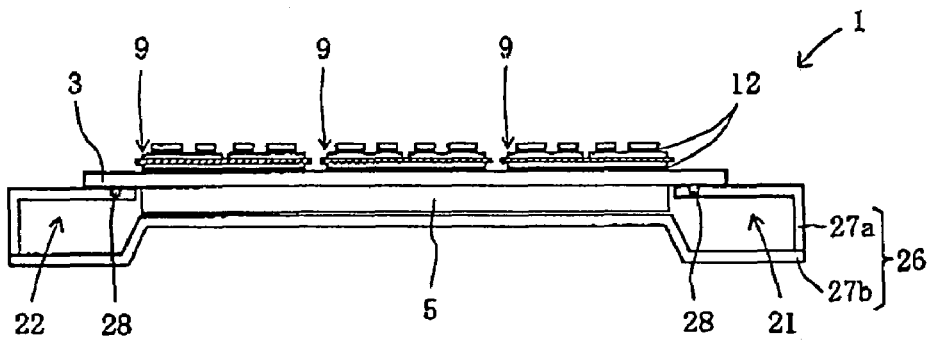
FIG. 4B is a cross-sectional view of the conventional direct cooling-type power semiconductor device seen from the direction perpendicular to FIG. 2.
Figure 5:
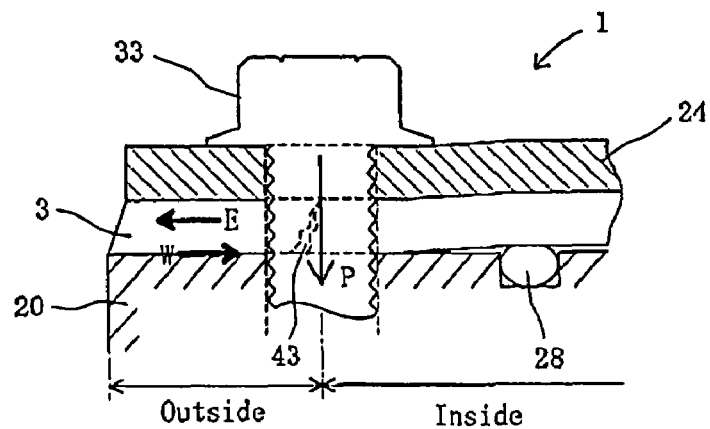
FIG. 5 is an enlarged cross-sectional view of a bolted portion of the conventional direct cooling-type power semiconductor device.

FIG. 7 illustrates the soldering step of the power semiconductor module 2 in the vacuum reflow furnace in accordance with the present invention. As described above with reference to FIG. 3, soldering foil or paste is used for soldering between the power semiconductor elements 8 (the IGBT elements or FWD elements) and the insulated substrates 9, and between the insulated substrates 9 and the finned base plate 3. In addition, the vacuum reflow furnace includes the bottom heater 41 and the top heater 42, which are respectively disposed as heat sources inside of the heat exchanger plate 40 and on the ceiling of the vacuum reflow furnace.

In the present embodiment, the projecting length of the radiation fins 5 toward the base plate 4 is set to be 0.2 to 1.0 mm shorter than that of the peripheral wall 6, as shown in a partially enlarged view in FIG. 7, and therefore even when the finned base plate 3 is placed on the heat exchanger plate 40, the tips of the radiation fins 5 are not brought into direct contact with the heat exchanger plate 40. In addition, considering the liquid tightness for the cooling medium after integration with the cooling jacket, the peripheral wall end surfaces 7 to be brought into contact with the heat exchanger plate 40 are polished to a surface roughness Ra of 1 μm or less, thereby ensuring that the peripheral wall end surfaces 7 are satisfactorily brought into contact with the heat exchanger plate 40. In addition, even if the surface roughness of the peripheral wall end surface 7 is 2 μm or less, the contact state with the heat exchanger plate 40 during the soldering step and the liquid tightness of the flow passage for the cooling medium after integration of the finned base plate 3 with the cooling jacket via the seal materials 28 are not compromised.

As such, in the power semiconductor device 1 according to the present embodiment, the contact area between the peripheral wall end surfaces 7 and the heat exchanger plate 40 is large, and the solder is melted with uniform thermal conduction, so that the first problem can be solved. Also, in the power semiconductor device 1 according to the present embodiment, the intake port 21 and the discharge port 22 are disposed at the diagonally-opposed corners of the cooling jacket 20, and therefore the cooling medium flows uniformly, so that the second problem can be solved.

Second Embodiment

Figure 10:
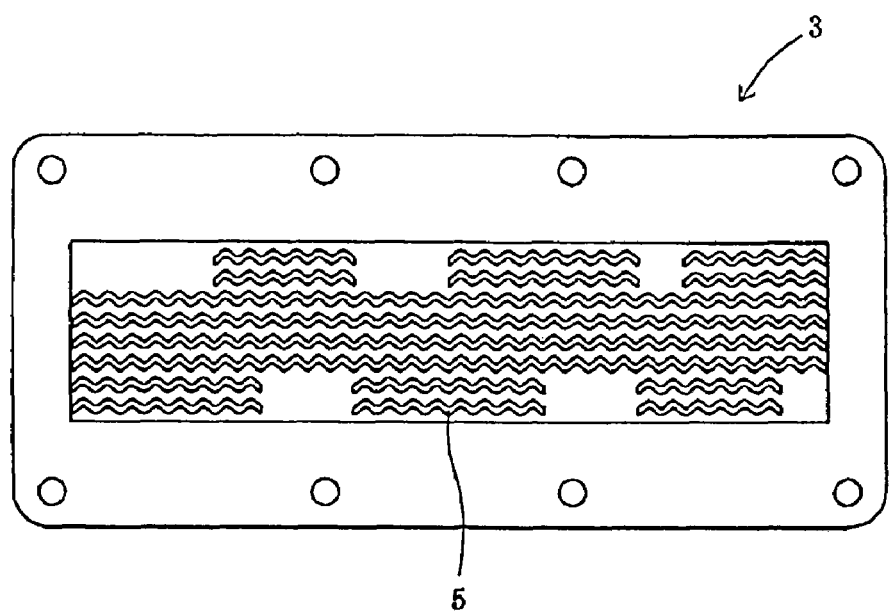
FIG. 10 is a top view of a finned base plate in a second embodiment.

The radiation fins 5 can be formed into another shape. For example, the finned base plate 3 according to a second embodiment shown in FIG. 10 includes wavy radiation fins 5 having a large contact area with the cooling medium and a high thermal conduction coefficient. The wavy radiation fins 5 are disposed along the flowing direction of the cooling medium. In addition, the wavy radiation fins 5 are disposed so as to converge immediately below the power semiconductor elements, and therefore it is possible to efficiently radiate heat while minimizing, insofar as possible, the pressure loss of the cooling medium flow. Note that the radiation fins 5 can be provided in the form of pin-fin arrays having a high thermal conduction coefficient and a superior radiation performance.

Third Embodiment

Figure 11:
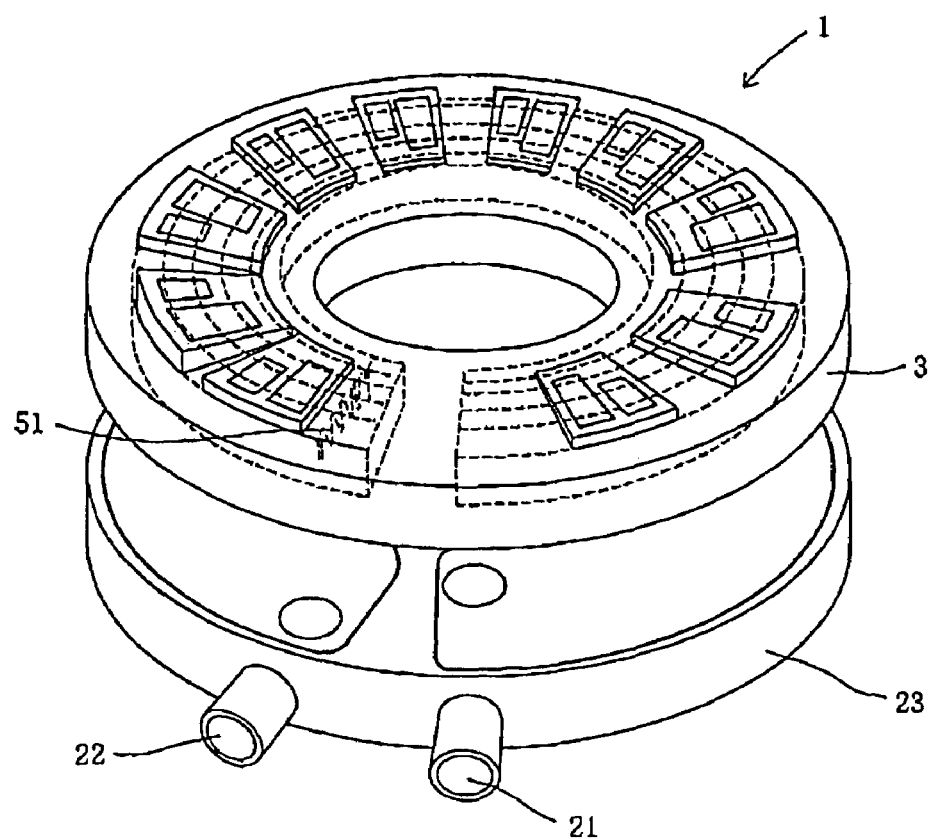
FIG. 11 is an exploded perspective view of a power semiconductor device according to a third embodiment.

A power semiconductor device 1 according to a third embodiment shown in FIG. 11 can be integrated with a drive motor for hybrid or electric vehicles by applying a planar ring-like finned base plate 3. A plurality of radiation fins 51 are concentrically disposed about the center axis of the ring, as shown in FIG. 11. With the configuration shown in FIG. 11, the end wall of a housing 23 for the drive motor that includes the intake port 21 and the discharge port 22 can be used in place of the cooling jacket 20 to form the flow passage for the cooling medium, thereby making it possible to achieve a reduction in size and weight as well as a reduction in cost. In addition, an inverter device can be disposed close to the drive motor to be driven by the inverter device, so that circuit connection wiring can be shortened, thereby reducing power loss via the wiring.

Furthermore, the power semiconductor device 1 according to the present embodiment has a hollowed portion that can be used as an area through which to pass a motor shaft or in which to dispose wiring for supplying power to the drive motor.

Described next are power semiconductor devices according to fourth to ninth embodiments that are capable of solving the third problem.

Fourth Embodiment

Figure 12A:
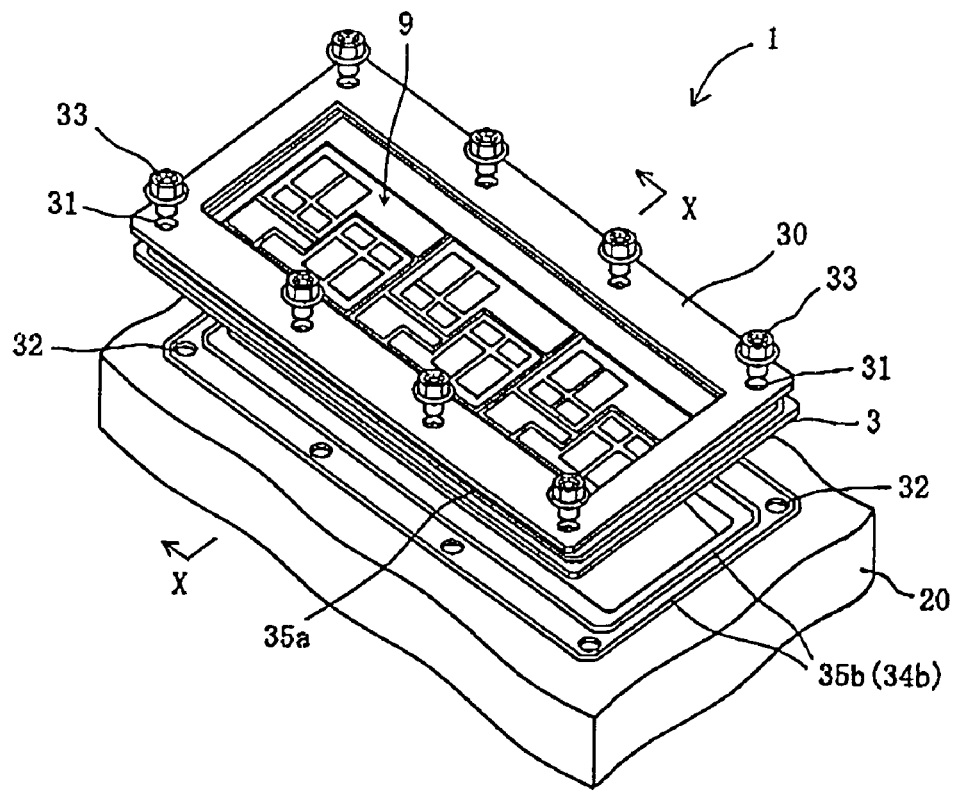
FIG. 12A is a perspective view of a power semiconductor device according to a fourth embodiment.
Figure 12B:
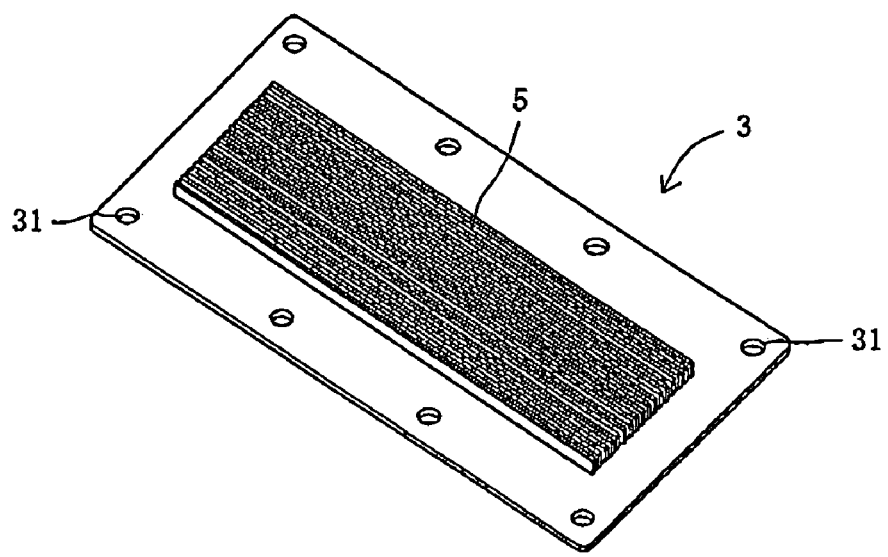
FIG. 12B is a perspective view of a finned base plate of the power semiconductor device according to the fourth embodiment seen from the bottom surface side.

FIGS. 12A and 12B illustrate the 600V/600A class direct cooling-type power semiconductor device according to the fourth embodiment. The power semiconductor device 1 essentially consists of the finned base plate 3, the cooling jacket 20, and a reinforcing plate 30 bolted to the cooling jacket 20, along with the finned base plate 3. Three insulated substrates 9 are soldered to the top surface of the finned base plate 3, and furthermore a plurality of power semiconductor elements are mounted on the top surface of each insulated substrate 9. The insulated substrates 9 are of the same aluminum nitride type, and they constitute upper and lower arms of a phase U inverter, a phase v inverter, and a phase W inverter, respectively. Note that for the sake of simplification, the housing surrounding the top surface side of the finned base plate 3, and the aluminum wiring (see FIG. 1B) are omitted in FIG. 12A.

The finned base plate 3 in the present embodiment is provided with a total of eight through-holes 31 used for inserting bolts 33, each having a diameter of 7 mm, an overall size of 10 cm×21 cm, and a thickness of about 11 mm. In addition, the finned base plate 3 is an Al—SiC composite plate plated with Ni on each surface.

The power semiconductor device 1 according to the present embodiment has the reinforcing plate 30 of about 3 mm thick stacked on the top surface side of the finned base plate 3 so as to surround the three insulated substrates 9, as shown in FIG. 12A. The reinforcing plate 30 has the same overall size as the finned base plate 3, i.e., 10 cm×21 cm, and has its inner portion of 6 cm×19 cm excluded therefrom so as not to interfere with the insulated substrates 9. Also, in order to bolt the reinforcing plate 30 to the cooling jacket 20, along with the finned base plate 3, the reinforcing plate 30 is provided with a total of eight through-holes 31 of 7 mm dia. at the same positions as in the finned base plate 3. Note that the reinforcing plate 30 can be integrally formed with the unillustrated housing.

The radiation fins 5 are integrally formed with the bottom surface of the finned base plate 3 in the present embodiment, as shown in FIG. 12B. In the present embodiment, seventeen radiation fins 5 are formed in parallel to the longitudinal direction of the finned base plate 3 (the flowing direction of the cooling medium), and their projecting length and width are 8 mm and 1.5 mm, respectively. In addition, the radiation fins 5 are 3 mm pitch, and discrete flow passage portions between the radiation fins 5 are 1.5 mm wide. The radiation fins 5 are cooled by 50 vol. % long-life coolant (LLC) mainly composed of ethylene glycol. The Above-described shape and arrangement of the radiation fins 5 and the cooling medium are merely illustrative, and they can be suitably changed.

Figure 13A:
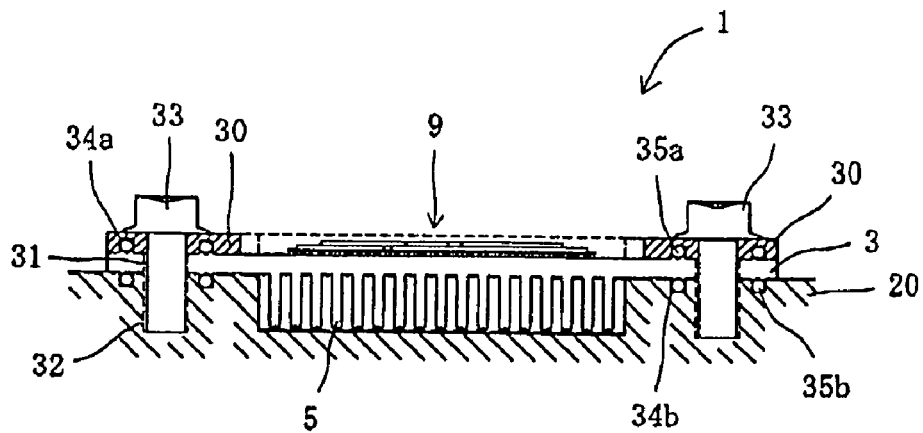
FIG. 13A is an overall cross-sectional view of the power semiconductor device according to the fourth embodiment.
Figure 13B:
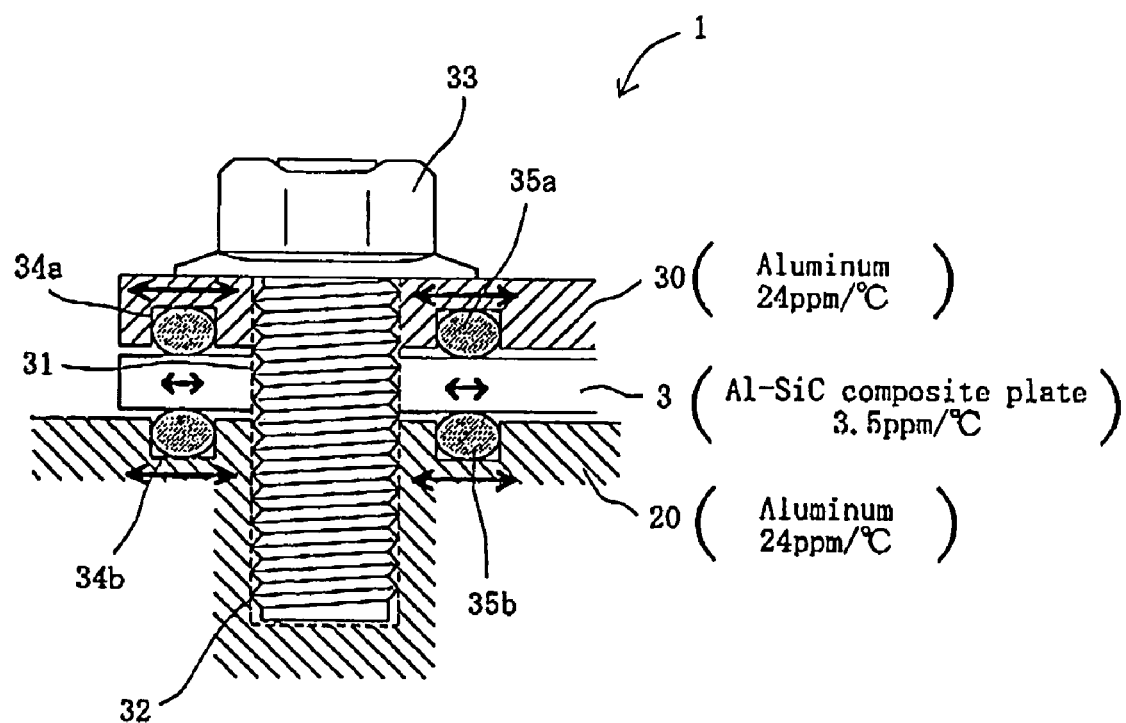
FIG. 13B is an enlarged cross-sectional view of a bolted portion of the power semiconductor device according to the fourth embodiment.

FIGS. 13A and 13B are cross-sectional views of the power semiconductor device according to the present embodiment. FIG. 13A illustrates a cross-sectional structure of the power semiconductor device 1 taken along line X-X in FIG. 12A, in which the finned base plate 3 is disposed on the cooling jacket 20, and the reinforcing plate 30 is further stacked thereon. The reinforcing plate 30 and the finned base plate 3 are fixed to the cooling jacket 20 with tightening fixtures (in the present embodiment, bolts 33 are used by way of example) that pass through the through-holes 31 made in both the reinforcing plate 30 and the finned base plate 3 and are screwed in bolt holes 32. The bolts 33 used are M6 bolts with a tightening torque of about 4 N·m.

Grooves 34a of 2.4 mm wide and 1.4 mm deep are formed inside and outside with respect to the through-holes 31 in the reinforcing plate 30, and an O-ring 35a (corresponding to a "first buffering member" in the present invention) is disposed in each groove. Similarly, grooves 34b of 2.4 mm wide and 1.4 mm deep are formed inside and outside with respect to the bolt holes 32 in the cooling jacket 20, and an O-ring 35b (corresponding to a "second buffering member" in the present invention) is disposed in each groove. The O-rings 35a and 35b are 1.9 mm dia. In addition, the dimensions of the grooves 34a and 34b to be formed are determined considering the material compositions and elasticity of the O-rings 35a and 35b. Note that the term "inside" refers to an area, that is located in the vicinity of the through-holes 31 arranged in a perimeter portion of the finned base plate 3 and is enclosed by the through-holes 31, while the term "outside" refers to an area that is not enclosed by the through-holes 31 (i.e., an area close to the edge of the finned base plate 3).

FIG. 13B is an enlarged cross-sectional view of a bolted portion of the power semiconductor device 1 shown in FIG. 13A. In the present embodiment, the reinforcing plate 30 and the cooling jacket 20 are made up of aluminum having a linear expansion coefficient of 24 ppm/° C. In addition, as described above, the finned base plate 3 preferably has a linear expansion coefficient of 3 to 8 ppm/° C., and in the present embodiment, the finned base plate 3 is formed by an Al—SiC composite plate of 3.5 ppm/° C. That is, the finned base plate 3 is disposed between the reinforcing plate 30 and the cooling jacket 20, both of which have a relatively high linear expansion coefficient. Note that stainless steel (linear expansion coefficient: 10 to 17 ppm/° C.) can be selected as the material of the reinforcing plate 30 and the cooling jacket 20, and in particular, when the reinforcing plate 30 and the cooling jacket 20, both having a linear expansion coefficient of 10 ppm/° C. or more, are used in combination with the finned base plate 3 formed by the Al—SiC composite plate, the third problem can be effectively solved.

In general, power semiconductor devices to be mounted in vehicles are required to deal with temperature variations in the range from −40 to +85° C. (ΔT=125° C.), and the finned base plate 3, the reinforcing plate 30, and the cooling jacket 20 expand/contract in accordance with their respective linear expansion coefficients. As is apparent from arrows schematically representing the degrees of thermal expansion/contraction of the components in FIG. 13B, the finned base plate 3 differs from the reinforcing plate 30 and the cooling jacket 20 in the amount of dimensional variations with respect to the same temperature change.

In the case of the power semiconductor device 1 shown in FIGS. 13A and 13B, even if the finned base plate 3, the reinforcing plate 30, and the cooling jacket 20 thermally expand/contract due to the temperature change as described above, no cracks are caused in the finned base plate 3. Specifically, the power semiconductor device 1 according to the present embodiment can ensure the reliability under environmental temperature conditions required for power semiconductor devices to be mounted in vehicles.

This is ensured because the first buffering members 35a are disposed outside and inside with respect to the through-holes 31 in the reinforcing plate 30, and the second buffering members 35b are disposed outside and inside with respect to the bolt holes 32 in the cooling jacket 20. It is thereby possible to prevent the finned base plate 3 from being in direct contact with the cooling jacket 20 and the reinforcing plate 30, which have different linear expansion coefficients from the finned base plate 3, and also possible to allow the pressing force P to be uniformly applied to the finned base plate 3 by bolting.

Fifth Embodiment

Figure 14:
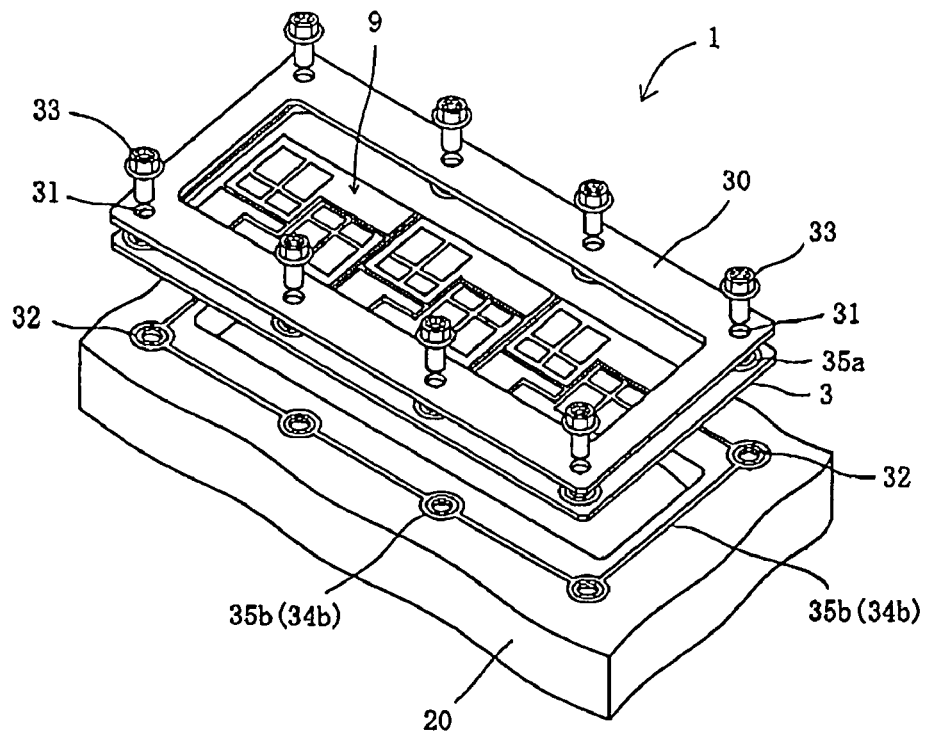
FIG. 14 is an exploded perspective view of a power semiconductor device according to a fifth embodiment.

FIG. 14 illustrates the power semiconductor device according to the fifth embodiment. In this power semiconductor device 1, the number of O-rings 35a and 35b to be used is reduced to one each from two each in the fourth embodiment. The O-rings 35a and 35b in the present embodiment are shaped so as to roughly encircle the through-holes 31 in the reinforcing plate 30 and the bolt holes 32 in the cooling jacket 20, respectively, and connect adjacent bolted portions, as shown in FIG. 14, and they are disposed in the groove 34a formed in the reinforcing plate 30 and the groove 34b in the cooling jacket 20, respectively.

The power semiconductor device 1 according to the present embodiment makes it possible to achieve an effect equivalent to that achieved by the power semiconductor device according to the fourth embodiment, and also to ensure the reliability under environmental temperature conditions required for power semiconductor devices to be mounted in vehicles. In addition, the power semiconductor device 1 according to the present embodiment makes it possible to reduce the amount of material used for the O-rings 35a and 35b.

Sixth Embodiment

Figure 15:
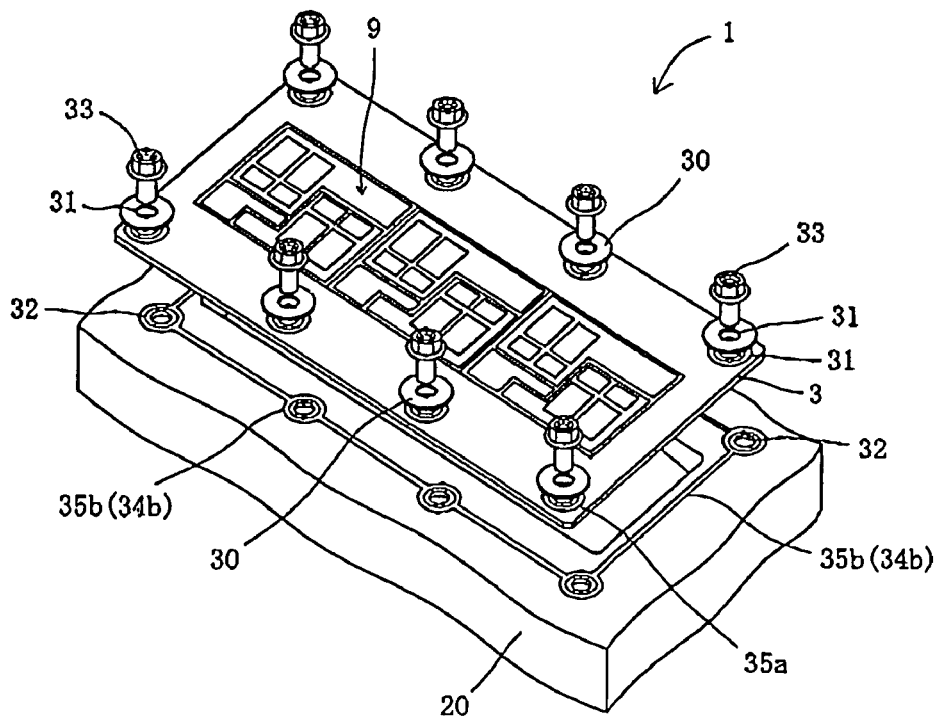
FIG. 15 is an exploded perspective view of a power semiconductor device according to a sixth embodiment.

FIG. 15 illustrates the power semiconductor device according to the sixth embodiment. This power semiconductor device 1 has a thin disk-like reinforcing plate 30 provided per bolted portion. In addition, unlike the O-ring 35a in the fifth embodiment, O-rings 35a disposed between the reinforcing plate 30 and the finned base plate 3 are not shaped to connect adjacent bolted portions. This is because there is no possibility where the cooling medium might leak out between the reinforcing plate 30 and the finned base plate 3.

The power semiconductor device 1 according to the present embodiment makes it possible to achieve an effect equivalent to those achieved by the power semiconductor devices according to the fourth and fifth embodiments, and also to reduce the amount of material used for the O-rings 35a and 35b.

Seventh Embodiment

Figure 16:
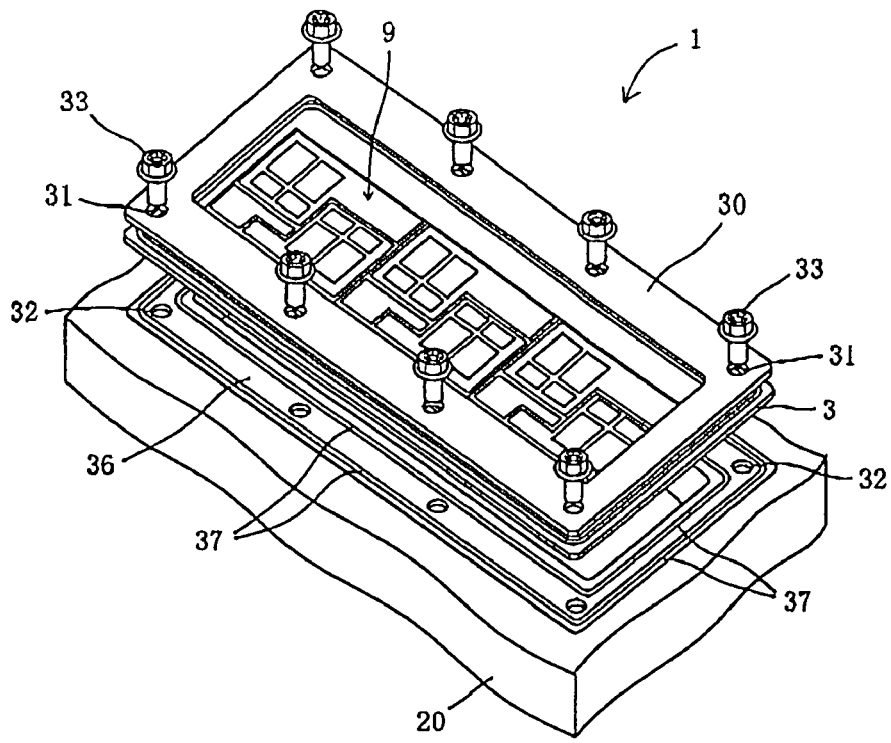
FIG. 16 is an exploded perspective view of a power semiconductor device according to a seventh embodiment.

FIG. 16 illustrates the power semiconductor device according to the seventh embodiment. This power semiconductor device 1 uses a metal gasket 36 as the second buffering member between the finned base plate 3 and the cooling jacket 20. The metal gasket 36 is obtained by covering a thin metal plate having partial protrusions 37 with elastic resin. In the present embodiment, the linear protrusions 37 of about 0.2 mm high are formed respectively inside and outside with respect to the bolted portions. The protrusions 37 may be formed into another shape, e.g., a shape roughly encircling the bolted portions so as to connect them to their adjacent bolted portions, as in the case of the O-ring 35b in the fifth embodiment (see FIG. 14).

The power semiconductor device 1 according to the present embodiment makes it possible to achieve an effect equivalent to those achieved by the power semiconductor devices according to the fourth and fifth embodiments, and also to ensure the reliability under environmental temperature conditions required for power semiconductor devices to be mounted in vehicles.

Eighth Embodiment

Figure 17:
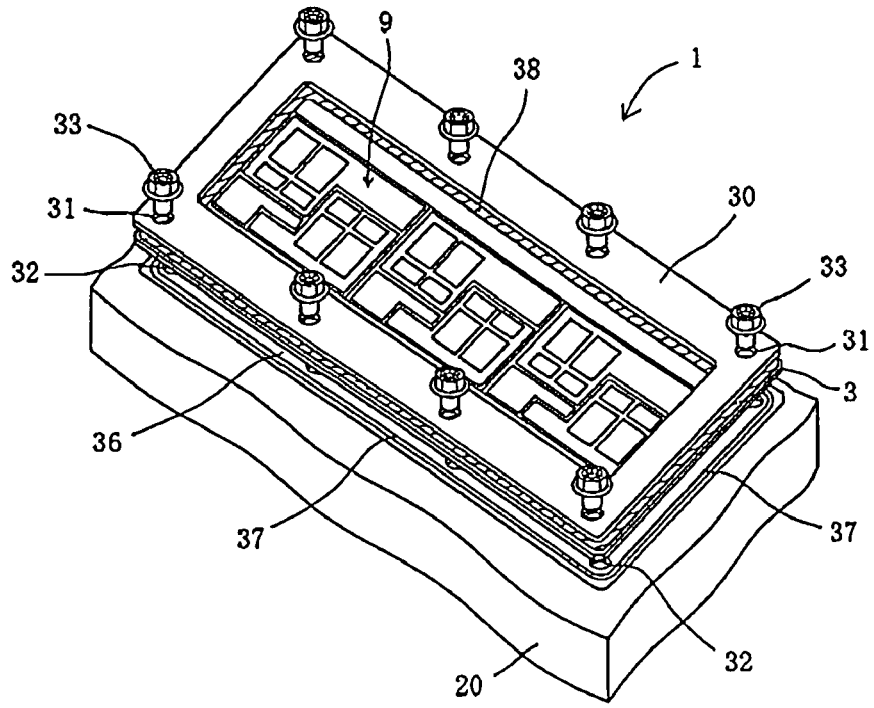
FIG. 17 is an exploded perspective view of a power semiconductor device according to an eighth embodiment.

FIG. 17 illustrates the power semiconductor device according to the eighth embodiment. This power semiconductor device 1 uses an adhesive resin layer 38 made up of elastic silicone-based adhesive resin as the first buffering member between the reinforcing plate 30 and the finned base plate 3. The silicone-based adhesive resin is applied to the finned base plate 3 so as to surround the bolted portions, and the reinforcing plate 30 is placed thereon. As a result of this, the silicone-based adhesive resin can be thinly spread over a large area without leaving any space between the reinforcing plate 30 and the finned base plate 3. Thereafter, the silicone-based adhesive resin is subjected to heat treatment, thereby curing the adhesive resin layer 38 having a certain level of elasticity.

In the case of the power semiconductor device 1 according to the present embodiment, it is not necessary to prepare different buffering members (O-rings or suchlike) in accordance with the shape and dimensions of the finned base plate 3, and therefore it is possible to reduce initial cost to produce the power semiconductor device 1. Note that it is possible to achieve a similar effect even when epoxy-based low-elasticity resin or urethane resin is used as the adhesive resin layer 38, in place of the silicone-based adhesive resin.

Ninth Embodiment

Figure 18:
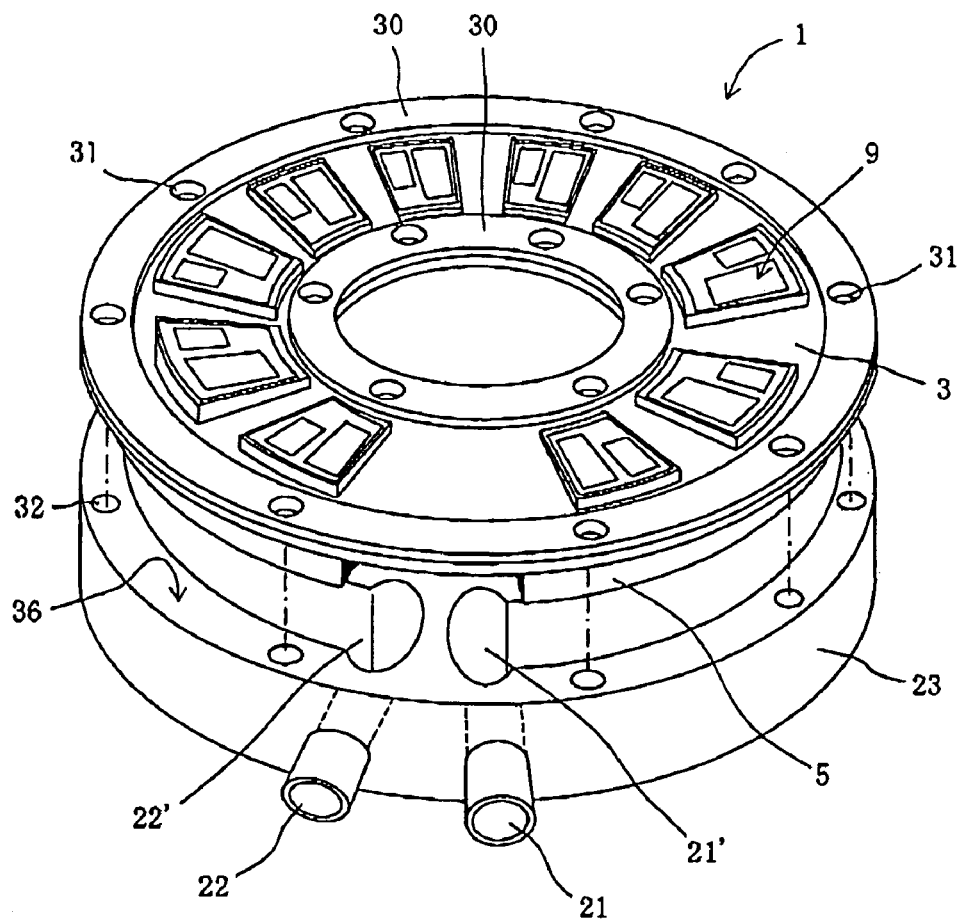
FIG. 18 is an exploded perspective view of a power semiconductor device according to a ninth embodiment.

FIG. 18 illustrates the power semiconductor device according to the ninth embodiment in which the finned base plate 3 has a planar ring shape. With the configuration shown in FIG. 18, the flow passage for the cooling medium can be formed using the edge wall of the housing 23 for the drive motor, in place of the cooling jacket 20, as in the power semiconductor device according to the fourth embodiment, and therefore it is possible to achieve a reduction in size and weight, as well as a reduction in cost. In addition, the inverter device can be disposed close to the drive motor to be driven by the inverter device, so that circuit connection wiring can be shortened, thereby reducing power loss via the wiring.

In the power semiconductor device 1 according to the present embodiment, some of the various buffering members in the fourth to eighth embodiments are applicable as the first buffering member (not shown) between the reinforcing plate 30 and the finned base plate 3, and the second buffering member (not shown) between the finned base plate 3 and the motor housing 23. Accordingly, the power semiconductor device 1 according to the present embodiment makes it possible to solve the third problem as in the power semiconductor devices according to the other preceding embodiments, and also to ensure the reliability under environmental temperature conditions required for power semiconductor devices to be mounted in vehicles.

Other Embodiments

While the foregoing has been described with respect to the preferred embodiments of the power semiconductor module and the power semiconductor device according to the present invention, the present invention is not limited to these configurations.

Figure 19:
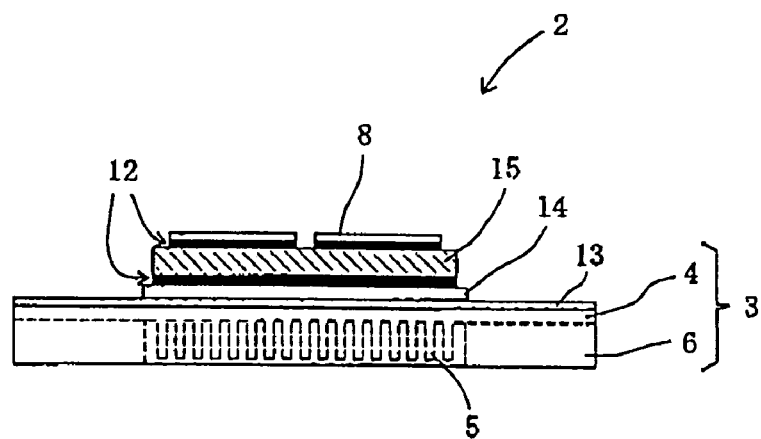
FIG. 19 is a cross-sectional view illustrating a mounted state of power semiconductor elements applicable to the power semiconductor modules and the power semiconductor devices according to the embodiments.

For example, a power semiconductor module 2 shown in FIG. 19 is intended for cost reduction through substitution of insulated resin layers for the insulated substrates, which are expensive. This power semiconductor module 2 has an insulated resin layer 13 disposed in close contact with the top surface side of the finned base plate 3, and a patterned conductor plate 14 further disposed thereon. The patterned conductor plate 14 is formed by joining a copper plate onto the insulated resin layer 13, and removing unnecessary portions from the copper plate through an etching process, thereby only leaving conductor patterns (i.e., patterning the copper plate).

In the power semiconductor module 2 shown in FIG. 19, the power semiconductor elements 8 are soldered to the thermal diffusion plate 15, which is soldered to the patterned conductor plate 14. The thermal diffusion plate is made up of a material (e.g., copper) that is superior in thermal conductivity and heat capacity, so that heat generated by the power semiconductor elements 8 can be rapidly diffused toward the in-plane direction, and can radiate from the finned base plate 3. Thus, it is possible to prevent any transient temperature rise due to abrupt heat generation by the power semiconductor elements 8.

When it is desirable to enhance environmental resistance such as heat cycle performance, the material of the thermal diffusion plate 15 may be replaced with another material having a small linear expansion coefficient (e.g., a copper-molybdenum composite material). In addition, when the amount of heat generated by the power semiconductor elements 8 is not particularly significant, the thermal diffusion plate 15 may be omitted so that the power semiconductor elements 8 are directly joined to the patterned conductor plate 14.

Also, as for the power semiconductor module 2 and the power semiconductor device 1 in each embodiment, the size of each component, the number of insulated substrates 9 to be mounted on the finned base plate 3, the number of power semiconductor elements 8 to be mounted on the insulated substrates 9, the number of radiation fins 5, the shape of the radiation fins 5, and so on, can be suitably changed.

Also, as for the power semiconductor device according to the present invention, the buffering members in the fourth to eighth embodiments may be suitably used in combination as the first buffering member between the reinforcing plate 30 and the finned base plate 3 and the second buffering member between the finned base plate 3 and the cooling jacket 20. For example, the adhesive resin layer 38 (the eighth embodiment, see FIG. 17) may be used as the first buffering member, and the O-ring 35b (the sixth embodiment, see FIG. 15) may be used as the second buffering member.

Figure 20:
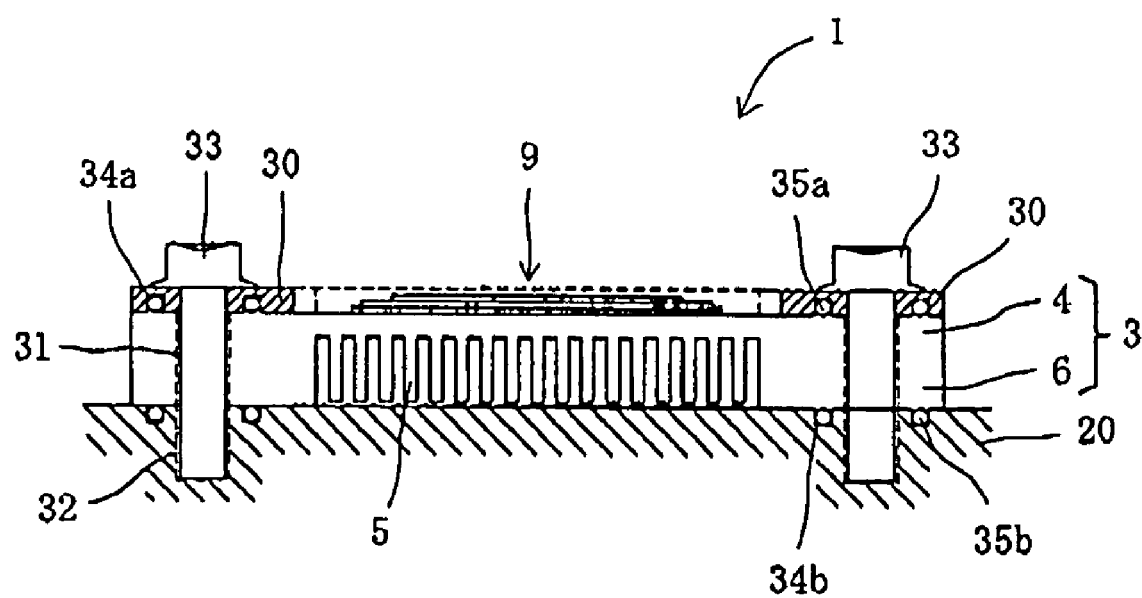
FIG. 20 is an overall cross-sectional view of a power semiconductor device provided with a finned base plate having a peripheral wall, in place of the finned base plate of the power semiconductor device according to the fourth embodiment.

While the fourth to ninth embodiments have been described with respect to the direct cooling-type power semiconductor devices 1 using the finned base plate 3 integrally formed with the radiation fins 5, the present invention is applicable to any power semiconductor devices in which a planar base plate having no radiation fins 5 integrally formed therewith is directly cooled. Furthermore, the finned base plate 3 used in the fourth embodiment can be provided with the peripheral wall 6, as shown in FIG. 20. Similarly, the finned base plates 3 used in the fifth to ninth embodiments can also be provided with the peripheral wall 6.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A power semiconductor module comprising:
   a plurality of power semiconductor elements;
   a plurality of insulated substrates having the power semiconductor elements soldered on their top surfaces;
   a planar base plate having bottom surfaces of the insulated substrates soldered on its top surface;
   a plurality of radiation fins projecting from an area on a bottom surface side of the base plate, the area being on the opposite side to a junction area between the insulated substrates and the base plate; and
   a peripheral wall projecting from the bottom surface side of the base plate so as to surround the radiation fins,
   wherein the base plate, the radiation fins, and the peripheral wall are integrally formed to constitute a finned base plate,
   wherein the radiation fins are disposed along a flowing direction of a cooling medium,
   wherein a projecting length of the radiation fins is less than or equal to that of the peripheral wall,
   wherein the peripheral wall has end surfaces present in the same plane, and
   wherein the finned base plate is an aluminum-silicon carbide composite material having a linear expansion coefficient of 3 to 10 ppm/° C.

2. The power semiconductor module according to claim 1, wherein the insulated substrates each include:
   an insulated ceramic layer; and
   metal layers attached to both surfaces of the insulated ceramic layer.

3. The power semiconductor module according to claim 1, wherein the finned base plate has a planar ring shape, and the radiation fins are concentrically disposed about a center axis of the ring shape.

4. A power semiconductor module comprising:
   a plurality of power semiconductor elements;
   a thermal diffusion plate having the power semiconductor elements soldered on its top surface;
   an insulated resin layer disposed on a bottom surface side of the thermal diffusion plate;
   a planar base plate having the insulated resin layer in close contact with its top surface;
   a plurality of radiation fins projecting from an area on a bottom surface side of the base plate, the area being on the opposite side to a junction area between the insulated resin layer and the base plate; and
   a peripheral wall projecting from the bottom surface side of the base plate so as to surround the radiation fins,
   wherein the base plate, the radiation fins, and the peripheral wall are integrally formed to constitute a finned base plate,
   wherein the radiation fins are disposed along a flowing direction of a cooling medium,
   wherein a projecting length of the radiation fins is less than or equal to that of the peripheral wall,
   wherein the peripheral wall has end surfaces present in the same plane and
   wherein the finned base plate is an aluminum-silicon carbide composite material having a linear expansion coefficient of 3 to 10 ppm/° C.

5. The power semiconductor module according to claim 4, wherein the difference in projecting length between the radiation fins and the peripheral wall is 0.2 to 1.0 mm.

6. The power semiconductor module according to claim 4, wherein the end surfaces of the peripheral wall have a surface roughness of 2 μm or less.

7. The power semiconductor module according to claim 4, wherein a taper inclined by 15° to 45° toward the radiation fins with respect to a vertical direction is formed at an inner wall surface of the peripheral wall surrounding the radiation fins, the surface being perpendicular to the flowing direction of the cooling medium flowing between the radiation fins.

8. The power semiconductor module according to claim 4, wherein the finned base plate has a planar ring shape, and the radiation fins are concentrically disposed about a center axis of the ring shape.

9. A power semiconductor device comprising:
a power semiconductor module of claim 4; and
a cooling jacket attached to the end surfaces of the peripheral wall in the power semiconductor module via a seal material, so as to for discrete portions of a flow passage for the cooling medium between the radiation fins,
wherein the cooling jacket has an intake port for introducing the cooling medium into the flow passage, and a discharge port for discharging the cooling medium from the flow passage, such that the intake port and the discharge port are disposed at diagonally-opposed corners of a space constituting the flow passage.

10. The power semiconductor device according to claim 9, wherein the seal material is an O-ring or metal gasket formed by an elastic material mainly composed of ethylene propylene- or silicone-based resin.

11. A power semiconductor device comprising:
a base plate having power semiconductor elements to be cooled mounted on its top surface side;
a reinforcing plate disposed on the top surface side of the base plate;
a cooling jacket fixed to a bottom surface side of the base plate with a plurality of tightening fixtures passing through the reinforcing plate and the base plate, the cooling jacket having a flow passage for a cooling medium formed to intervene in a position with respect to the base plate;
a first buffering member disposed between the reinforcing plate and the base plate; and
a second buffering member disposed between the base plate and the cooling jacket,
wherein the cooling jacket and the reinforcing plate each have a linear expansion coefficient greater than that of the base plate, and
wherein the first buffering member and the second buffering member are respectively disposed at least inside and outside with respect to the tightening fixtures.

12. The power semiconductor device according to claim 11, wherein the base plate includes a plurality of radiation fins formed on an area on its bottom surface side, the area being on the opposite side to an area in which the power semiconductor elements are mounted, and wherein the radiation fins are accommodated in the flow passage, so that the cooling medium flows between the radiation fins.

13. The power semiconductor device according to claim 11, wherein the first buffering member and the second buffering member are each selected from among an O-ring, a metal gasket, and an adhesive resin layer.

14. The power semiconductor device according to claim 11, wherein the reinforcing plate is integrally formed with a housing surrounding the power semiconductor elements.

15. The power semiconductor device according to claim 11, wherein the reinforcing plate and/or the cooling jacket is/are made up of aluminum or stainless steel.

16. A power semiconductor module comprising:
a plurality of power semiconductor elements;
a plurality of insulated substrates having the power semiconductor elements soldered on their top surfaces;
a planar base plate having bottom surfaces of the insulated substrates soldered on its top surface;
a plurality of radiation fins projecting from an area on a bottom surface side of the base plate, the area being on the opposite side to a junction area between the insulated substrates and the base plate; and
a peripheral wall projecting from the bottom surface side of the base plate so as to surround the radiation fins,
wherein the base plate, the radiation fins, and the peripheral wall are integrally formed to constitute a finned base plate,
wherein the radiation fins are disposed along a flowing direction of a cooling medium,
wherein a projecting length of the radiation fins is less than or equal to that of the peripheral wall,
wherein the peripheral wall has end surfaces present in the same plane, and
wherein the difference in projecting length between the radiation fins and the peripheral wall is 0.2 to 1.0 mm.

17. A power semiconductor module comprising:
a plurality of power semiconductor elements;
a plurality of insulated substrates having the power semiconductor elements soldered on their top surfaces;
a planar base plate having bottom surfaces of the insulated substrates soldered on its top surface;
a plurality of radiation fins projecting from an area on a bottom surface side of the base plate, the area being on the opposite side to a junction area between the insulated substrates and the base plate; and
a peripheral wall projecting from the bottom surface side of the base plate so as to surround the radiation fins,
wherein the base plate, the radiation fins, and the peripheral wall are integrally formed to constitute a finned base plate,
wherein the radiation fins are disposed along a flowing direction of a cooling medium,
wherein a projecting length of the radiation fins is less than or equal to that of the peripheral wall,
wherein the peripheral wall has end surfaces present in the same plane, and
wherein the end surfaces of the peripheral wall have a surface roughness of 2 µm or less.

18. A power semiconductor module comprising:
a plurality of power semiconductor elements;
a plurality of insulated substrates having the power semiconductor elements soldered on their top surfaces;
a planar base plate having bottom surfaces of the insulated substrates soldered on its top surface;
a plurality of radiation fins projecting from an area on a bottom surface side of the base plate, the area being on the opposite side to a junction area between the insulated substrates and the base plate; and
a peripheral wall projecting from the bottom surface side of the base plate so as to surround the radiation fins,
wherein the base plate, the radiation fins, and the peripheral wall are integrally formed to constitute a finned base plate,
wherein the radiation fins are disposed along a flowing direction of a cooling medium,
wherein a projecting length of the radiation fins is less than or equal to that of the peripheral wall,
wherein the peripheral wall has end surfaces present in the same plane, and wherein a taper inclined by 15° to 45° toward the radiation fins with respect to a vertical direction is formed at an inner wall surface of the peripheral wall surrounding the radiation fins, the surface being perpendicular to the flowing direction of the cooling medium flowing between the radiation fins.

19. A power semiconductor module comprising:

a plurality of power semiconductor elements;

a plurality of insulated substrates having the power semiconductor elements soldered on their top surfaces;

a planar base plate having bottom surfaces of the insulated substrates soldered on its top surface;

a plurality of radiation fins projecting from an area on a bottom surface side of the base plate, the area being on the opposite side to a junction area between the insulated substrates and the base plate; and a peripheral wall projecting from the bottom surface side of the base plate so as to surround the radiation fins, wherein the base plate, the radiation fins, and the peripheral wall are integrally formed to constitute a finned base plate, wherein the radiation fins are disposed along a flowing direction of a cooling medium, wherein a projecting length of the radiation fins is less than or equal to that of the peripheral wall, wherein the peripheral wall has end surfaces present in the same plane, a cooling jacket attached to the end surfaces of the peripheral wall in the power semiconductor module via a seal material, so as to form discrete portions of a flow passage for the cooling medium between the radiation fins, and wherein the cooling jacket has an intake port for introducing the cooling medium into the flow passage, and a discharge port for discharging the cooling medium from the flow passage, such that the intake port and the discharge port are disposed at diagonally-opposed corners of a space constituting the flow passage.

20. The power semiconductor device according to claim 19, wherein the seal material is an O-ring or metal gasket formed by an elastic material mainly composed of ethylene propylene- or silicone-based resin.

* * * * *

UNITED STATES PATENT AND TRADEMARK OFFICE
CERTIFICATE OF CORRECTION

PATENT NO. : 7,564,129 B2  
APPLICATION NO. : 12/079012  
DATED : July 21, 2009  
INVENTOR(S) : Raita Nakanishi et al.

Page 1 of 1

It is certified that error appears in the above-identified patent and that said Letters Patent is hereby corrected as shown below:

Title Page, please insert the two Foreign Japanese Priority Applications, as indicated below:

--(30) Foreign Application Priority Data

March 30, 2007 (JP).................... 2007-092777

June 18, 2007 (JP)...................... 2007-159783--

Signed and Sealed this

Twenty-second Day of September, 2009

David J. Kappos
*Director of the United States Patent and Trademark Office*